US008216482B2

(12) United States Patent
Kim et al.

(10) Patent No.: US 8,216,482 B2
(45) Date of Patent: Jul. 10, 2012

(54) METHOD OF MANUFACTURING INKJET PRINTHEAD

(75) Inventors: Jong-Seok Kim, Hwaseong-Si (KR); Yong-Seop Yoon, Seoul (KR); Moon-Chul Lee, Seongnam-Si (KR); Yong-Won Jeong, Seoul (KR); Dong-Sik Shim, Suwon-Si (KR); Hyung Choi, Seongnam-Si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 427 days.

(21) Appl. No.: 12/428,808

(22) Filed: Apr. 23, 2009

(65) Prior Publication Data

US 2010/0051580 A1 Mar. 4, 2010

(30) Foreign Application Priority Data

Sep. 2, 2008 (KR) ........................ 10-2008-0086287

(51) Int. Cl.

| | |
|---|---|
| ***G01D 15/00*** | (2006.01) |
| ***G11B 5/127*** | (2006.01) |
| ***C23F 1/00*** | (2006.01) |
| ***H01L 21/00*** | (2006.01) |
| ***H01L 21/311*** | (2006.01) |

(52) U.S. Cl. ................ 216/27; 216/2; 438/39; 438/694; 438/695; 438/719

(58) Field of Classification Search .................... 438/39, 438/694, 695, 696, 719; 216/2, 27, 67, 78; 347/20, 56

See application file for complete search history.

(56) References Cited

U.S. PATENT DOCUMENTS

| | | | | |
|---|---|---|---|---|
| 6,399,516 | B1 * | 6/2002 | Ayon | 438/739 |
| 6,409,312 | B1 * | 6/2002 | Mrvos et al. | 347/54 |
| 6,412,921 | B1 * | 7/2002 | Manini | 347/65 |
| 6,749,285 | B2 * | 6/2004 | Liu et al. | 347/47 |
| 6,805,432 | B1 * | 10/2004 | Milligan et al. | 347/65 |
| 7,338,611 | B2 * | 3/2008 | Pollard et al. | 216/27 |
| 2007/0279458 | A1 * | 12/2007 | Lee et al. | 347/58 |
| 2008/0231665 | A1 * | 9/2008 | Lee et al. | 347/63 |
| 2008/0303869 | A1 * | 12/2008 | Park et al. | 347/54 |
| 2009/0001048 | A1 * | 1/2009 | Yoon et al. | 216/27 |
| 2010/0053272 | A1 * | 3/2010 | Shim et al. | 347/47 |

* cited by examiner

*Primary Examiner* — Parviz Hassanzadeh
*Assistant Examiner* — Margaret D Klunk
(74) *Attorney, Agent, or Firm* — Staas & Halsey LLP

(57) ABSTRACT

A method of manufacturing an inkjet printhead includes forming a chamber layer having multiple ink chambers on a substrate. A sacrificial layer is formed and is configured to fill a space associated with the ink chambers on the chamber layer. A nozzle layer is formed on the top surfaces of the chamber layer and the sacrificial layer and having multiple nozzles. An etching mask is prepared on the bottom surface of the substrate. The etching mask has at least one linear etching pattern configured to define a portion of the substrate in which an ink feed hole is to be formed. The substrate is etched through the linear etching pattern until the sacrificial layer is exposed and a through hole is formed. The through hole defines the portion of the substrate in which the ink feed hole is to be formed. The sacrificial layer and the portion of the substrate surrounded by the through hole are removed to form the ink feed hole.

3 Claims, 12 Drawing Sheets

METHOD OF MANUFACTURING INKJET PRINTHEAD

CROSS-REFERENCE TO RELATED PATENT APPLICATION

This application claims the benefit of Korean Patent Application No. 10-2008-0086287, filed on Sep. 2, 2008, in the Korean Intellectual Property Office, the disclosure of which is incorporated herein by reference in its entirety.

TECHNICAL FIELD

The present invention generally relates to a method of manufacturing a thermal inkjet printhead.

BACKGROUND OF RELATED ART

An inkjet printhead is a device used to produce a predetermined image by discharging or ejecting small ink droplets on a desired location on a printing medium. An inkjet printhead can be classified into two types based on the mechanism that is used for discharging the ink droplets. A first type is a thermal inkjet printhead that generates ink bubbles using a heat source and discharges or ejects the ink droplets as a result of an expansive force produced by the bubbles. A second type is a piezoelectric inkjet printhead in which a piezo-electric material is used and the ink droplets are discharged or ejected by pressure applied to the ink by a transformation or deformation of the piezo-electric material.

Below is described a mechanism for discharging ink droplets in a thermal inkjet printhead.

During an electrical pulse, current flows through a heater that includes a heating resistor. As a result of the current applied, heat is generated in the heater and ink that is adjacent to the heater is rapidly heated up to about 300 degrees Celsius (° C.). The ink boils to generate ink bubbles such that the ink bubbles expand and apply pressure to the ink that is within an ink chamber. Thus, the ink in the ink chamber that is adjacent to a nozzle is discharged or ejected from the ink chamber and through the nozzle in the form of ink droplets.

The thermal inkjet printhead can have a structure in which a chamber layer and a nozzle layer are disposed on a substrate (e.g., by sequential lamination or layering). The substrate is such that multiple layers of materials can be formed or disposed on the substrate. The chamber layer includes multiple ink chambers, each being configured to hold or be filled with ink to be discharged. The nozzle layer includes multiple nozzles through which ink from an associated ink chamber from the chamber layer is discharged. An ink feed hole for applying ink to the ink chambers is formed through the substrate. The ink feed hole can be configured such that the flow of ink to each of the ink chambers is substantially the same.

SUMMARY OF DISCLOSURE

A method of manufacturing a thermal inkjet printhead is described.

According to an aspect of the present general inventive concept, there is provided a method of manufacturing an inkjet printhead, which includes forming a chamber layer having multiple ink chambers on a substrate. A sacrificial layer is formed that fills the space associated with the ink chambers on the chamber layer. A nozzle layer is formed having multiple nozzles on the top surfaces of the chamber layer and the sacrificial layer. An etching mask is prepared on the bottom surface of the substrate having at least one linear etching pattern formed to define or surround a portion of the substrate in which an ink feed hole is to be formed. The bottom surface of the substrate is exposed and etched through the linear etching pattern until the sacrificial layer is exposed and a through hole is formed. The through hole defines or surrounds the portion of the substrate in which the ink feed hole is to be formed. The sacrificial layer and the portion of the substrate surrounded by the through hole are removed and the ink feed hole is formed.

The through hole may be formed by dry etching the substrate exposed through the linear etching pattern. The dry etching can include a deep reactive ion etching (DRIE) process. The etching mask can include a closed loop form defined by the linear etching pattern.

The etching mask can include one or more linear etching patterns which are spaced apart from each other by a predetermined distance. When forming the through hole by using the multiple linear etching patterns, multiple substrate connections can be made to remain on the bottom portion of the substrate that are used to connect the portion of the substrate surrounded by the through hole and the portion of the substrate disposed outside the through hole. The portion of the substrate that is surrounded by the through hole can be removed by an ultrasonic process that is applied during the removal of the sacrificial layer.

The method may further include, before forming of the chamber layer, forming an insulation layer on the substrate, sequentially forming multiple heaters for heating ink on the insulation layer and multiple electrodes for applying a current to the heaters, and forming a passivation layer on the insulation layer to cover the heaters and the electrodes. The method may further include forming an anti-cavitation layer on the passivation layer after. The method may further include forming a glue layer on the passivation layer after the anti-cavitation layer has been formed.

The method may further include forming a trench having a predetermined depth by sequentially etching the passivation layer, the insulation layer, and the upper portion of the substrate, after forming of the chamber layer. In this instance, the sacrificial layer can be configured to fill a space or volume associated with the trench and the ink chambers. The method may further include planarizing the top surfaces of the sacrificial layer and the chamber layer using a chemical mechanical polishing (CMP) process.

A width of the etching pattern on the etching mask can be adjusted based on the location of the inkjet printhead on the wafer and the type of wafer used.

According to the embodiments of the present invention, the ink feed hole can be made such that the shape and/or size of the ink feed hole is substantially uniformly and the manufacture process for making the inkjet printheads is simplified.

BRIEF DESCRIPTION OF THE DRAWINGS

Various aspects of the present disclosure will become apparent and more readily appreciated from the following description of the embodiments, taken in conjunction with the accompanying drawings, of which.

DETAILED DESCRIPTION OF SEVERAL EMBODIMENTS

Figure 1:
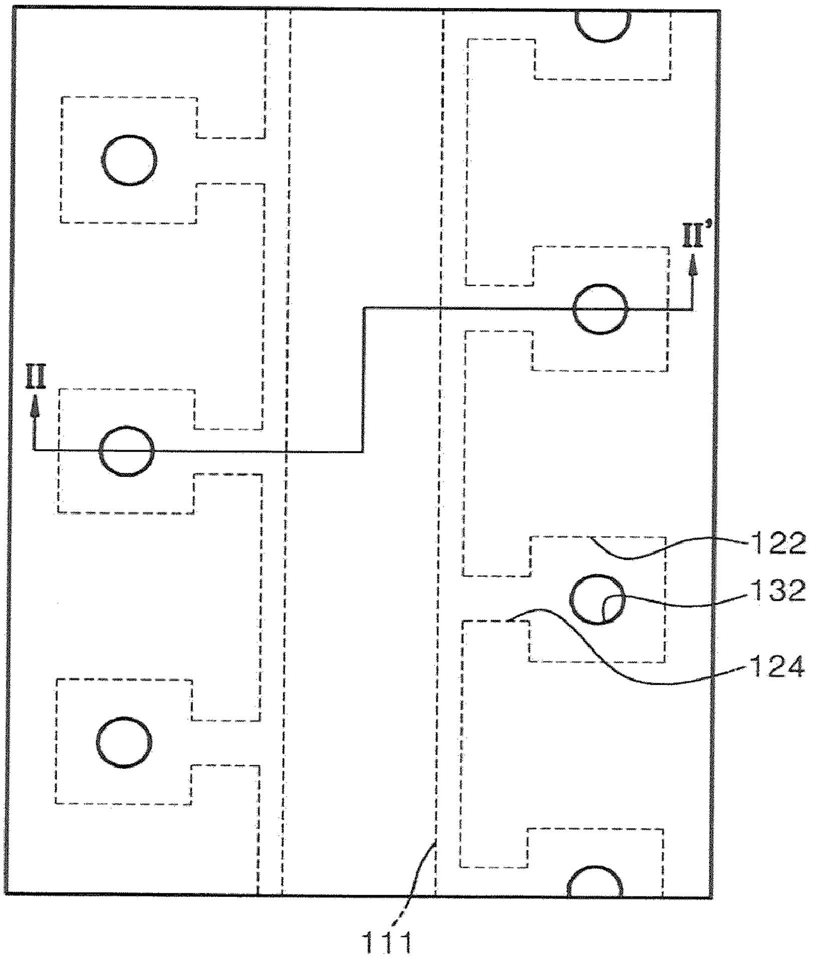
FIG. 1 is a plan view schematically illustrating a thermal inkjet printhead, according to an embodiment.

One or more embodiments of the invention will now be described more fully with reference to the accompanying drawings. In the drawings, like reference numerals denote like elements, and the sizes and thicknesses of layers and regions are exaggerated for clarity. While the embodiments are described with detailed construction and elements to assist in a comprehensive understanding of the various applications and advantages of the embodiments, it should be apparent however that the embodiments can be carried out without those specifically detailed particulars. It will also be understood that when a layer is referred to as being "on" another layer or a substrate, the layer can be directly on the other layer or the substrate, or there could be intervening layers between the layer and the other layer or substrate. In addition, each element included in an inkjet printhead can be made of materials other than the materials described with respect to the various embodiments. Moreover, in some instances, the order of a step in a method of manufacturing an inkjet printhead can vary.

Figure 2:
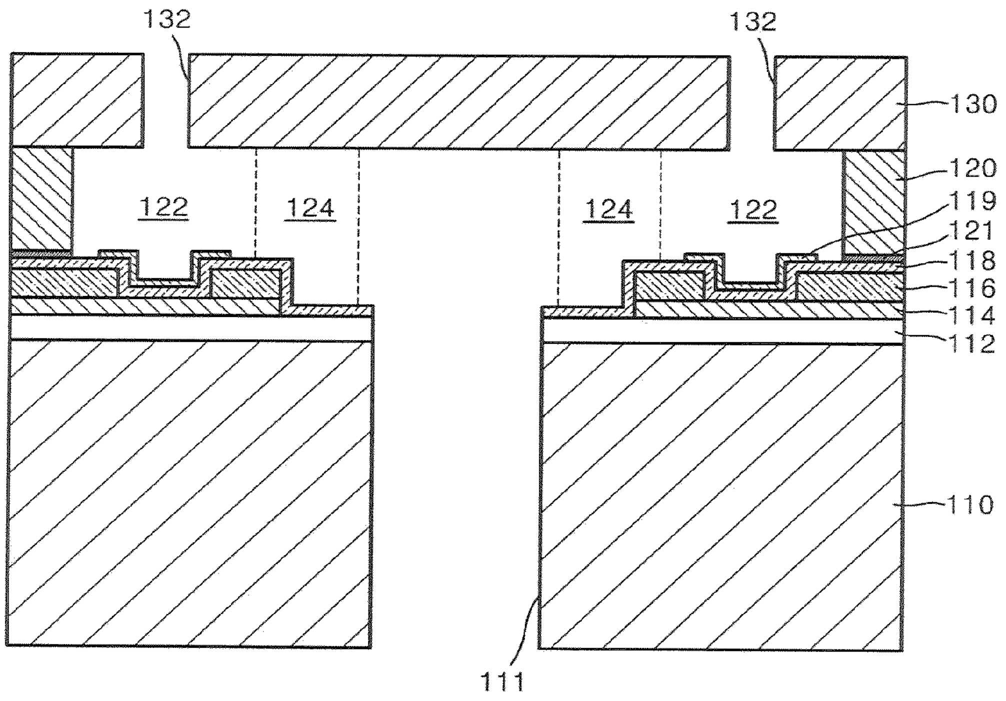
FIG. 2 is a cross sectional view of the thermal inkjet printhead of FIG. 1, which is taken along line II-II' of FIG. 1.

FIG. 1 is a plan view schematically illustrating a thermal inkjet printhead, according to an embodiment, and FIG. 2 is a cross sectional view of the thermal inkjet printhead of FIG. 1, which is taken along line II-II' of FIG. 1.

Referring to FIGS. 1 and 2, the inkjet printhead according to an embodiment may include a substrate 110, a chamber layer 120, and a nozzle layer 130. The substrate 110 may include multiple material layers that are formed or disposed thereon. The chamber layer 120 is disposed (e.g., laminated) on the substrate 110 and the nozzle layer 130 is disposed (e.g., laminated) on the chamber layer 120. The chamber layer 120 may include multiple ink chambers 122 for holding or storing ink. The nozzle layer 130 may include multiple nozzles 132 through which the ink from the ink chambers 122 is discharged or ejected. An ink feed hole 111 for supplying ink to the ink chambers 122 is configured or defined within the substrate 110. In addition, the chamber layer 120 can include multiple restrictors 124 for connecting the ink chambers 122 and the ink feed hole 111. The substrate 110 may be a silicon substrate, for example, while the chamber layer 120 and the nozzle layer 130 can each be made or formed by using an epoxy-based polymer, for example. A glue layer 121 can be formed between the substrate 110 and the chamber layer 120 and it is used to increase an adhesive strength between the substrate 110 and the chamber layer 120.

Moreover, an insulation layer 112 can be disposed or formed on the substrate 110 to provide insulation (e.g., thermal insulation) between heaters 114 and the substrate 110. The heaters 114, which are configured to produce ink bubbles by heating up the ink in the ink chambers 122, are formed on the insulation layer 112 in such a manner that each of the heaters 144 corresponds to one of the ink chambers 122. The electrodes 116 are disposed on the heaters 114. A passivation layer 118 is formed on the heaters 114 and the electrodes 116 to provide protection to the heaters 114 and the electrodes 116. Moreover, an anti-cavitation layer 119 can be disposed on the passivation layer 118 to protect the heaters 114 from a cavitation force that is produced when the ink bubbles burst.

A method of manufacturing the above-described inkjet printhead is described below with reference to FIGS. 3-8, according to one or more embodiments.

Figure 3:
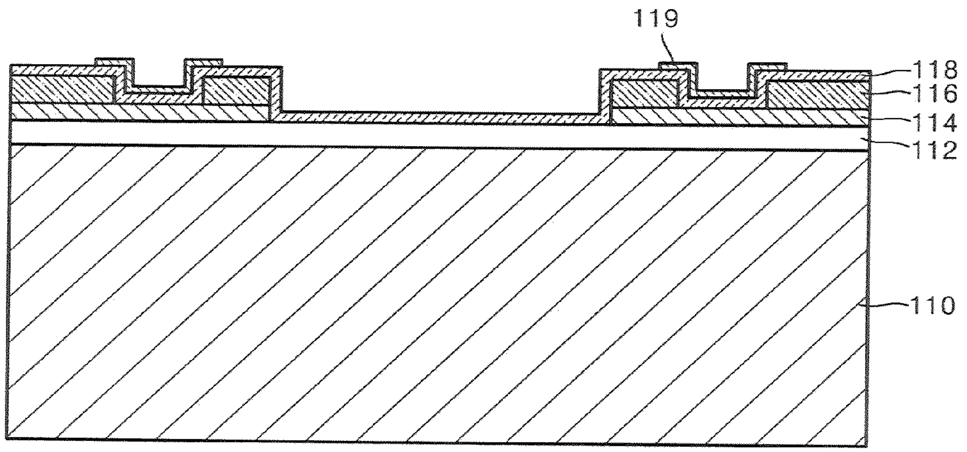
FIGS. 3-8 are diagrams that illustrate a method of manufacturing an inkjet printhead, according to an embodiment.

Referring to FIG. 3, the substrate 110 is prepared and the insulation layer 112 is disposed on the substrate 110. The substrate 110 can be a silicon substrate, for example. The insulation layer 112 is configured to insulate the substrate 110 from the heat produced by the heaters 114 and can be made of silicon oxide, for example. The multiple heaters 114 for heating the ink and for generating ink bubbles are formed on the top surface of the insulation layer 112. The heaters 114 can be made by depositing a heating resistor on the top surface of the insulation layer 112 and then patterning the heating resistor. The heating resistor can be made of, for example, an alloy of tantalum and aluminum, a tantalum nitride, a titanium nitride, or tungsten silicide. The electrodes 116 that are used to apply a current to the heaters 114 are formed on the top surfaces of the heaters 114. The electrodes 116 can be made by depositing a metal having excellent electrical conduction properties on the top surfaces of the heaters 114 and then patterning the metal. The metal from which the electrodes 116 are made can be, for example, aluminum, an aluminum alloy, gold, or silver.

The passivation layer 118 can be disposed on the insulation layer 112 and can be used to cover or protect the heaters 114 and the electrodes 116. The passivation layer 118 is configured to prevent the heaters 114 and the electrodes 116 from coming in direct contact with ink, which can result in oxidation or corrosion of the heaters 114 and the electrodes 116. The passivation layer 118 can be made of a silicon nitride or a silicon oxide, for example. Morevoer, the anti-cavitation layer 119 can be formed or disposed on the portion of the top surface of the passivation layer 118 that is disposed above the heaters 114. The anti-cavitation layer 119 is configured to protect the heaters 114 from a cavitation force that is produced when the ink bubbles burst. The anti-cavitation layer 119 can be made of tantalum, for example.

Figure 4:
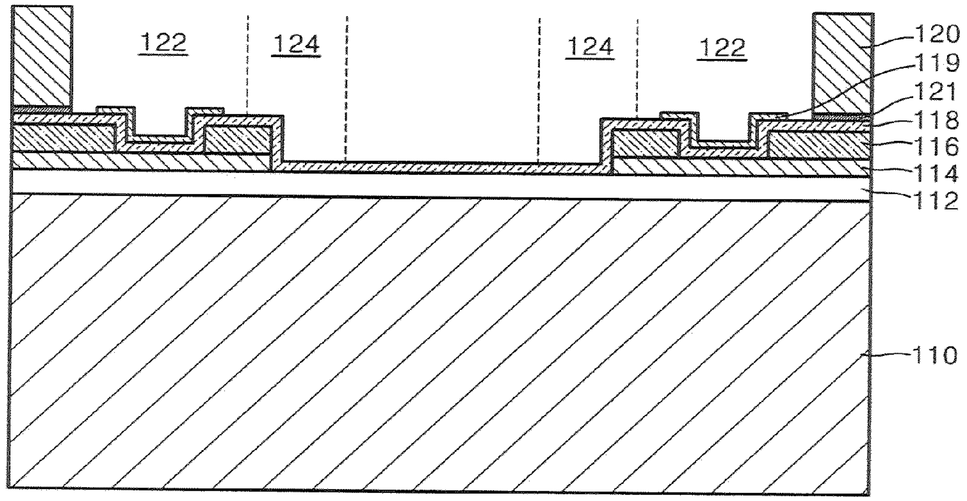

Referring to FIG. 4, the chamber layer 120, which has multiple ink chambers 122, is formed on the passivation layer 118. The chamber layer 120 can be made by coating or depositing a predetermined material such as a photosensitive epoxy resin, for example, on the substrate 110 to a predetermined thickness, and patterning the predetermined material using a photolithography process. The space or volume associated with the ink chambers 122 for holding or storing ink to be discharged is defined by portions of the chamber layer 120 such that each of the ink chambers 122 corresponds to one of the heaters 114. The ink chambers 122 can be disposed above or substantially above the heaters 114. Multiple restrictors 124 can be made in the chamber layer 120 to form a path that connects the ink chambers 122 and the ink feed hole 111, as will be further described below with respect to FIG. 8. Moreover, the glue layer 121 that is used to increase the adhesive strength between the passivation layer 118 and the chamber layer 120 can be formed on the passivation layer 118. The glue layer 121 can be made of, for example, any one of the materials used to make the chamber layer 120.

Figure 5:
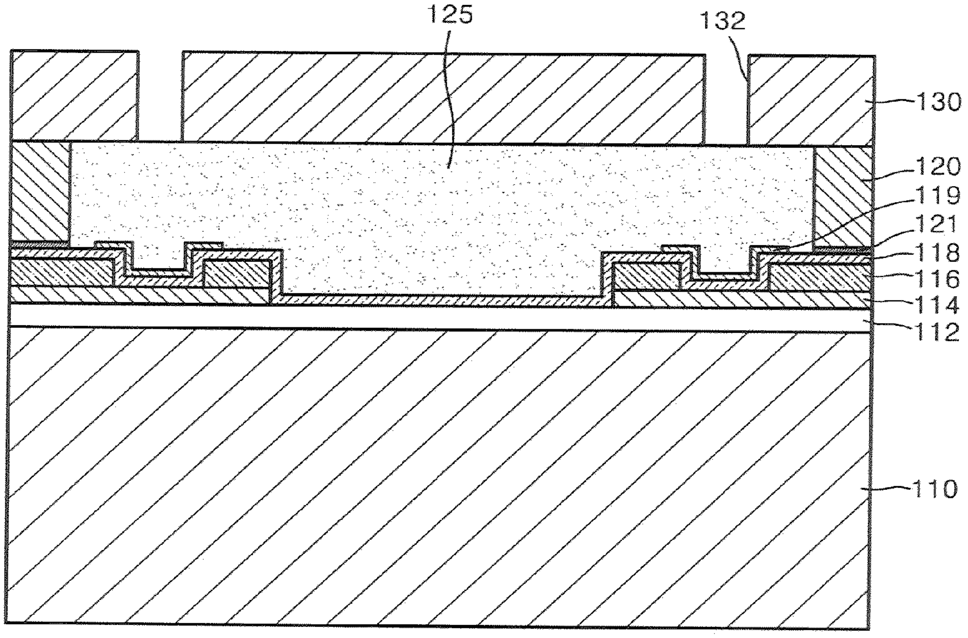

Referring to FIG. 5, a sacrificial layer 125 is disposed within the chamber layer 120 to fill the space or volume associated with the ink chambers 122 and the restrictors 124. The sacrificial layer 125 can be made of a material having etching selectivity with respect to the substrate 110, the chamber layer 120, and the nozzle layer 130. After the sacrificial layer 125 is formed, a process of chemical mechanical polishing (CMP) can be used to make the top surfaces of the sacrificial layer 125 and the chamber layer 120 substantially flat with respect to each other (e.g., planarization).

The nozzle layer 130 includes multiple nozzles 132 that are made or formed above the top surfaces of the chamber layer 120 and/or the sacrificial layer 125. The nozzle layer 130 can be made by coating a predetermined material such as a photosensitive epoxy resin, for example, on the top surfaces of the chamber layer 120 and the sacrificial layer 125, and patterning the predetermined material using a photolithography process. The multiple nozzles 132 are positioned in the nozzle layer 130 such that each nozzle 132 is above and exposes the top surface of the sacrificial layer 125 where the ink chamber 122 is to be located.

Figure 6A:
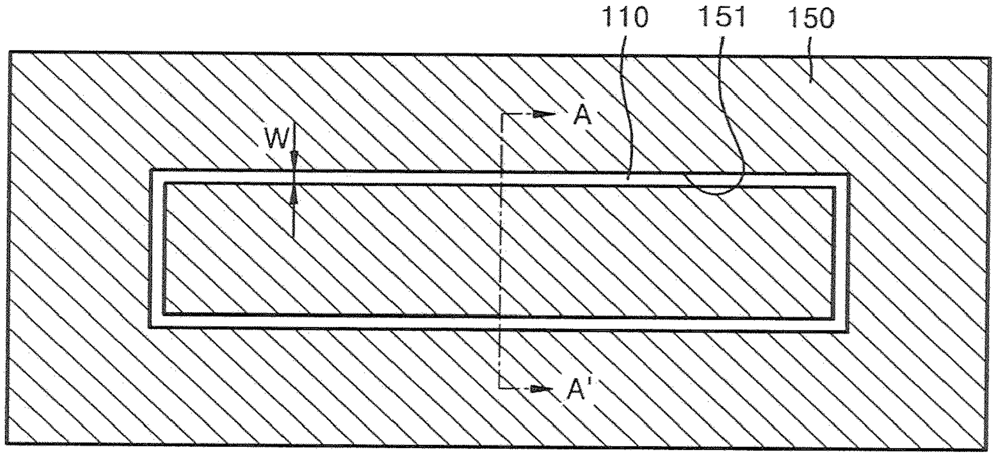
Figure 6B:
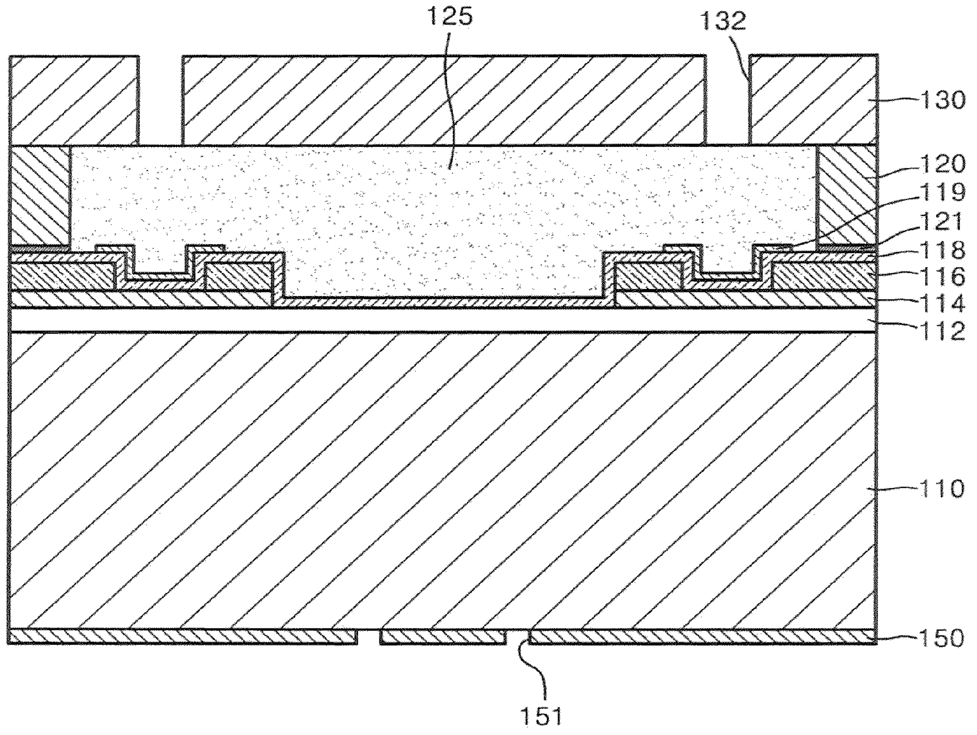

FIG. 6A illustrates an etching mask 150 prepared on the bottom surface of the substrate 110 and FIG. 6B is a cross sectional diagram of the inkjet printhead taken along line A-A' of FIG. 6A.

Referring to FIGS. 6A and 6B, the etching mask 150 has a predetermined etching pattern 151 and is disposed on the bottom surface of the substrate 110. The etching pattern 151 is made on the etching mask 150 and has a predetermined width (W) and a linear pattern that defines a closed loop, that is, the linear pattern is in the form of a closed loop. The closed loop form of the etching pattern 151 is such as to surround or define a region or portion of the substrate 110 in which the ink feed hole 111 (see FIG. 8) is to be formed. The etching mask 150 can be made by coating a predetermined photoresist on the bottom surface of the substrate 110 and patterning the predetermined photoresist to produce the etching pattern 151.

Figure 7A:
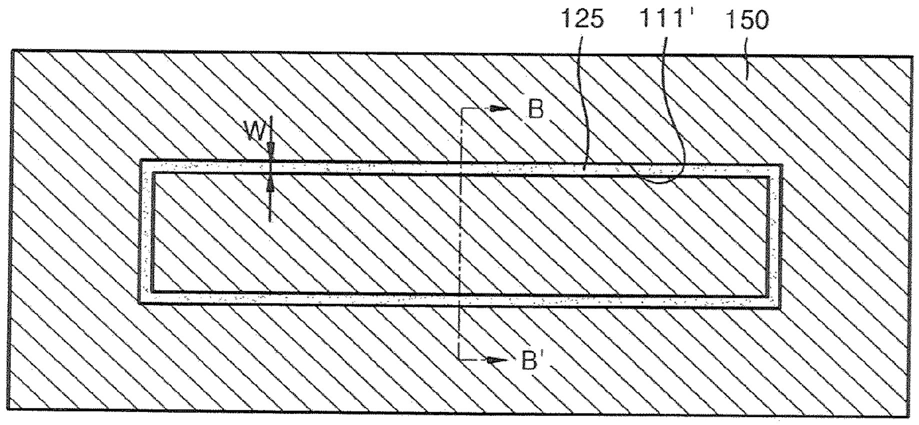
Figure 7B:
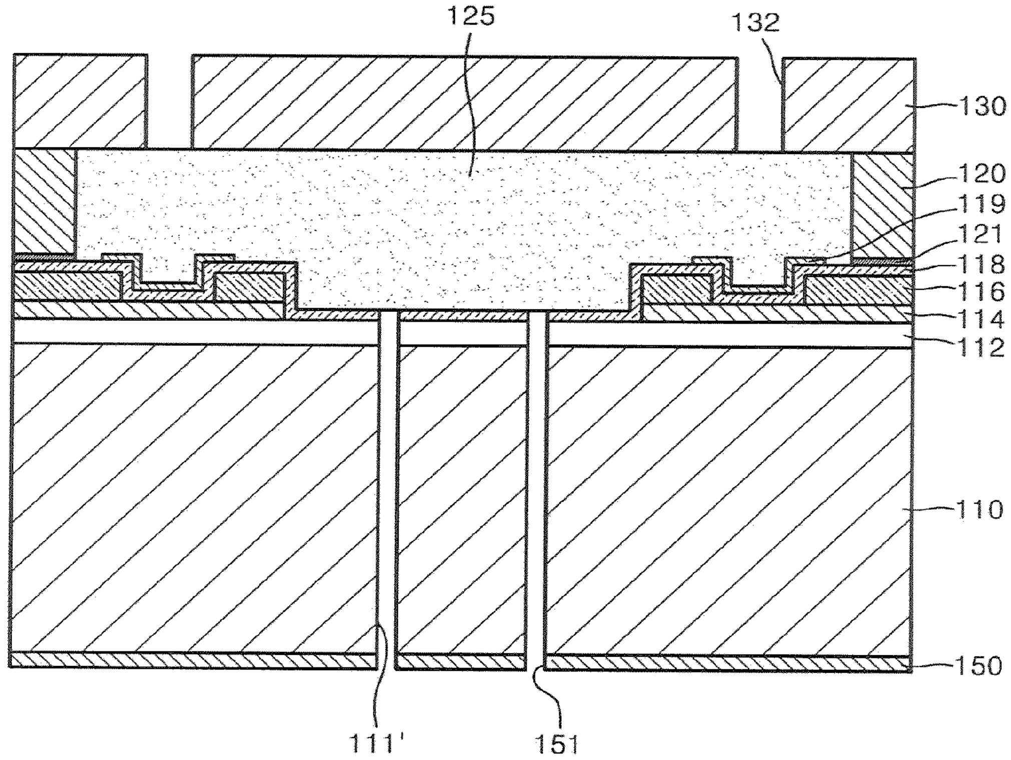

FIG. 7A illustrates the bottom surface of the substrate 110 after being etched by using the etching mask 150 and FIG. 7B is a cross sectional diagram of the inkjet printhead taken along line B-B' of FIG. 7A.

Referring to FIGS. 7A and 7B, the bottom surface of the substrate 110 is exposed through the etching pattern 151 of the etching mask 150 and is dry etched via deep reactive ion etching (DRIE), for example. Such dry etching of the substrate 110 is continued until a sufficient amount of the substrate 110 is removed to expose the sacrificial layer 125 and a through hole 111' corresponding to the shape of the etching pattern 151 is etched through the substrate 110. The through hole 111' can have a predetermined width and is configured to surround or define a portion of the substrate 110 in which the ink feed hole 111 is to be formed. The through hole 111' can be uniformly etched throughout the substrate 110 by using a dry etching technique such as DRIE. The width of the through hole 111' is determined by the width (W) of the etching pattern 151. After the through hole 111' is completed, the etching mask 150 disposed on the bottom surface of the substrate 110 is removed.

Figure 8:
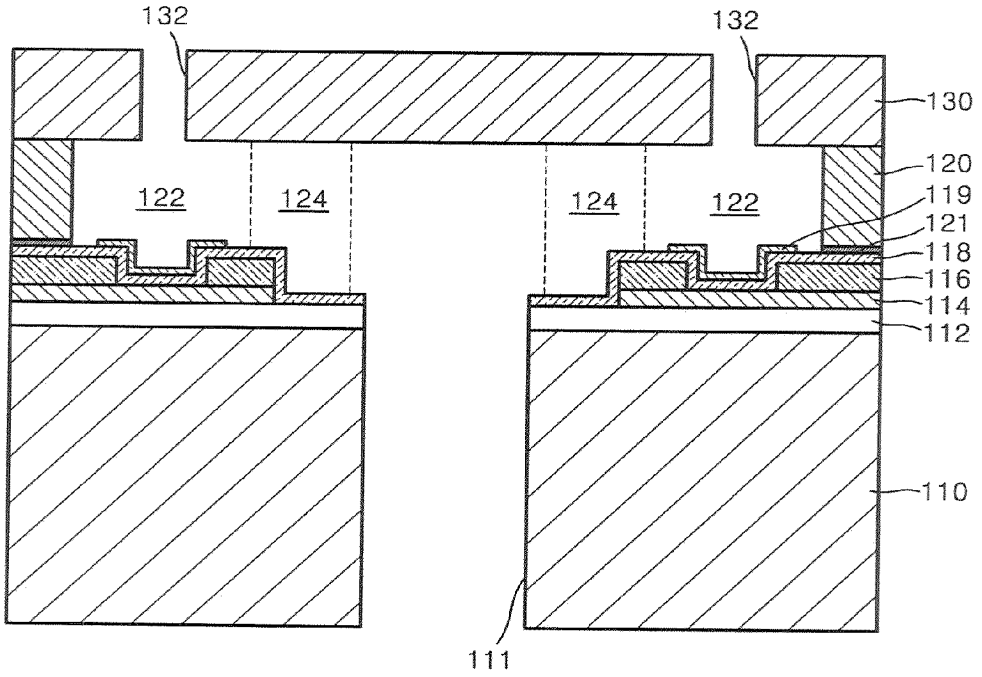

Referring to FIG. 8, during the process of removing the sacrificial layer 125, the portion of the substrate 110 that is within or surrounded by the through hole 111' is removed together or concurrently with the sacrificial layer 125. Because the portion of the substrate 110 that is surrounded by the through hole 111' is in contact with the bottom portion or surface of the sacrificial layer 125, when the portion of the sacrificial layer 125 that fills the restrictors 124 and the ink chambers 122 is removed by using an etching solution that selectively removes the sacrificial layer 125, the portion of the substrate 110 that is surrounded by the through hole 111' is also removed to form or define the ink feed hole 111. Thus, once the ink feed hole 111 that is configured to supply ink to the ink chambers 122 passes through the substrate 110, the manufacture of the inkjet printhead is completed.

In the above-described embodiment, the etching mask 150, in which the predetermined etching pattern 151 is formed, is used to dry etch the bottom surface of the substrate 110 to produce the through hole 111' that surrounds or defines the portion of the substrate 110 in which the ink feed hole 111 to be uniformly formed. Because the portion of the substrate 110 that is surrounded by the through hole 111' is removed along with the sacrificial layer 125, the shape and/or location of the ink feed hole 111 can be accurately produced by using a simple process.

In practice, multiple inkjet printheads are manufactured from a single wafer, such as a silicon wafer, for example. In an embodiment, the width of the etching pattern 151 on the etching mask 150 can vary in each wafers based on a design considerations such as, for example, the size of the inkjet printhead. In addition, the width of the etching pattern 151 can be adjusted according to the location of the etching pattern 151 on the wafer. For example, during dry etching of the wafer, the etching speed is faster in the central portion or central radial portion of the wafer than at the edge or outer radial portion of the wafer. Thus, when multiple etching patterns (i.e., multiple inkjet printheads) having the same widths are formed on one wafer, the ink feed hole 111 of the inkjet printhead manufactured at the center portion of the wafer has a different shape from that of the ink feed hole 111 of the inkjet printhead manufactured at the edge of the wafer. Accordingly, it is desirable for the etching pattern associated with an inkjet printhead manufactured on the edge of the wafer to have a larger width than that of the etching pattern associated with an inkjet printhead manufactured on the center portion of the wafer because, as the width of the etching pattern increases, the etching speed gets faster. Thus, when the width of the etching patterns associated with the inkjet printheads is gradually increased from the center portion of the wafer to the edge of the wafer, the ink feed holes produced in a single wafer can each have substantially the same shape and/or size.

Figure 9:
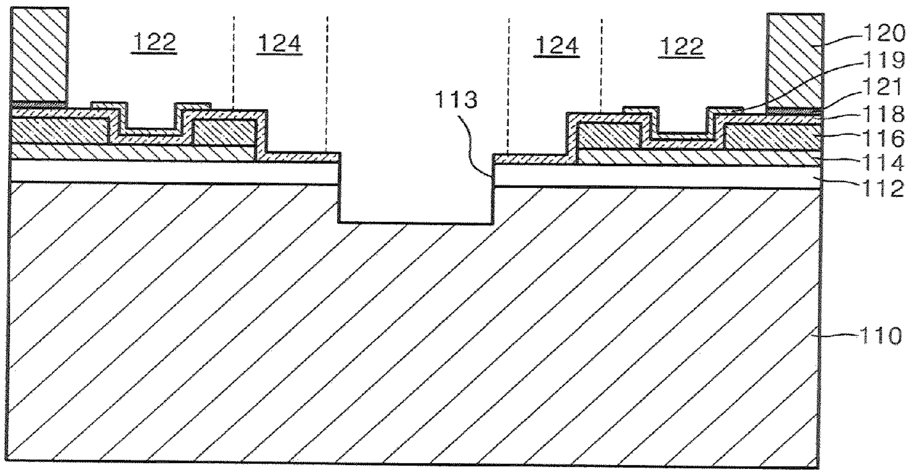
FIG. 9 is a diagram that illustrates a method of manufacturing an inkjet printhead, according to another embodiment.

FIG. 9 is a diagram that illustrates a method of manufacturing an inkjet printhead according to another embodiment. Referring to FIG. 9, and as described above with respect to FIG. 4, the chamber layer 120 is disposed on the substrate 110 and the passivation layer 118, the insulation layer 112, and the upper portions of the substrate 110 are sequentially etched, thereby forming a trench 113 having a predetermined depth. The trench 113 is disposed on the upper portion of the ink feed hole 111 to be formed (as illustrated in FIG. 8). A sacrificial layer 125, such as the one described above with respect to FIG. 5, is used to fill the space or volume associated with the trench 113, the ink chambers 122, and the restrictors 124. Subsequent processes are substantially the same as those described above and a detailed description thereof is thus not necessary.

Figure 10:
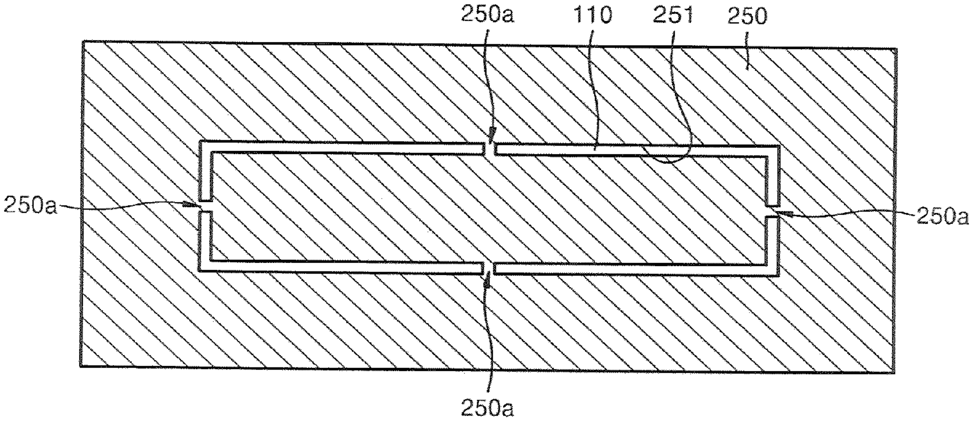
FIGS. 10-11B are diagrams that illustrate a method of manufacturing an inkjet printhead, according to yet another embodiment.
Figure 11A:
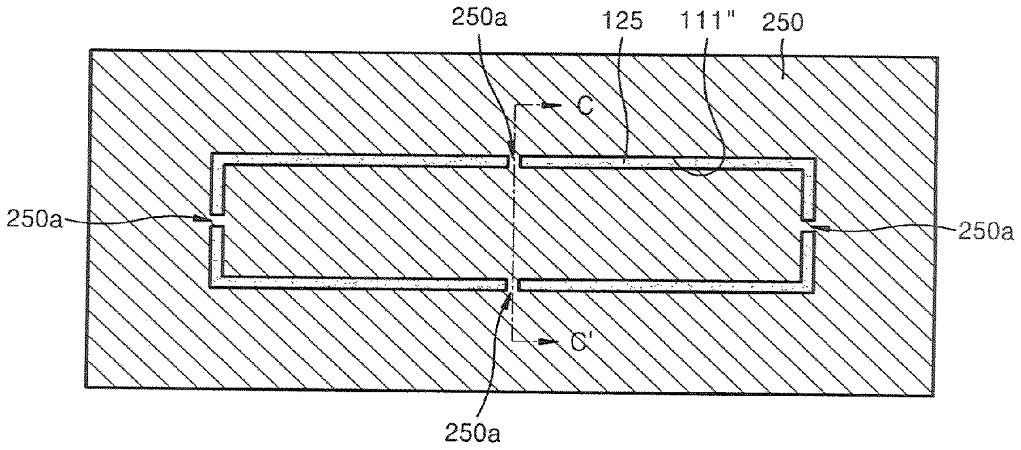
Figure 11B:
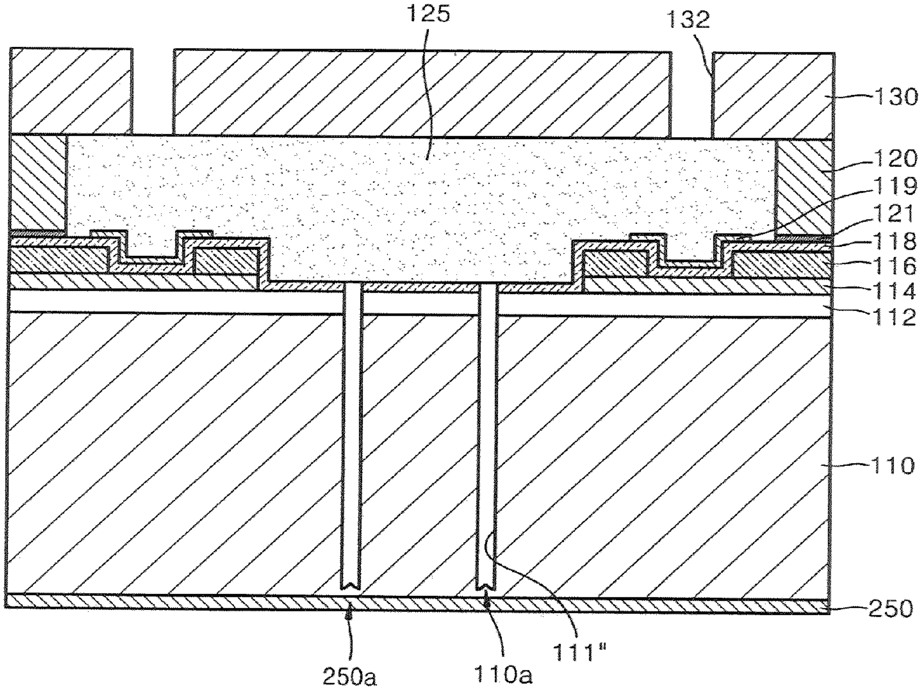

FIGS. 10 through 11B are diagrams that illustrate a method of manufacturing an inkjet printhead according to another embodiment. FIG. 10 illustrates multiple etching patterns 251 made on the bottom surface of the substrate 110. Referring to FIG. 10, after the nozzle layer 130 is formed as described in FIG. 5, an etching mask 250 in which the plurality of etching patterns 251 are formed is disposed on the bottom surface of the substrate 110. The multiple etching patterns 251 are linear patterns made such that the portion of the substrate 110 in which of the ink feed hole 111 is to be formed is surrounded or defined by the etching patterns 251. Multiple mask connections 250*a* are formed that correspond to gaps between the end portions of neighboring etching patterns 251. In FIG. 10, four etching patterns 251 and mask connections 250*a* are formed that define a non-closed loop, that is, have a non-closed loop form. In other embodiments, however, the number of the etching patterns 251 and mask connections 250*a* need not be limited to four as shown, and can be any number.

FIG. 11A illustrates the bottom surface of the substrate 10 after being etched using the etching mask 250 and FIG. 11B is a cross sectional view of the inkjet printhead taken along line C-C'. Referring to FIGS. 11A and 11B, the bottom surface of the substrate 110 is exposed through the multiple etching patterns 251 to a dry etched by using a deep reactive ion etching (DRIE), for example. Such dry etching of the substrate 110 is continued until a sufficient amount of the substrate 110 is removed to expose the sacrificial layer 125 and to etch a through hole 111" that defines or surrounds the portion of the substrate 110 in which the ink feed hole 111 is to be formed. The substrate connections 110*a* that connect the portion of the substrate 110 that is surrounded by the through hole 111" and the portion of the substrate 110 that is disposed outside the through hole 111" can be made on the bottom surface or portion of the substrate 110 and correspond to the mask connections 250*a*. The substrate connections 110*a* are not etched during the etching process used to form the through hole 111" because of the mask connections 250*a*. The substrate connections 110*a* fix or attach the portion of the substrate 110 that is surrounded by the through hole 111" to rest of the substrate 110 in such a manner that is not easy to separate the portion of the substrate 110 surrounded by the through hole 111" from the sacrificial layer 125.

The etching mask 250 is subsequently removed from the bottom surface of the substrate 110 and the sacrificial layer 125 is removed using an etching solution. When an ultrasonic process is used to remove the sacrificial layer 125, the portion of the substrate 110 surrounded by the through hole 111" is also removed and the ink feed hole 111, as illustrated in FIG. 8, is formed.

In FIG. 6A, the etching pattern 151 is formed on the etching mask in such a manner as to produce a closed loop form. In other embodiments, however, the etching pattern need not be so limited and can be formed in an open loop form in which both ends of a linear etching pattern are spaced apart from each other by a predetermined distance or spacing. When the substrate 110 is dry etched using such an etching pattern, the substrate connections 110*a* illustrated in FIG. 11B that connect the portion of the substrate 110 surrounded by the through hole 111" of FIG. 11B and the portion of the substrate 110 disposed outside the through hole 111" can be formed on the lower portion of the substrate 110.

While the present general inventive concept has been particularly shown and described with reference to exemplary embodiments thereof, it will be understood by those of ordinary skill in the art that various changes in form and details may be made therein without departing from the spirit and scope of the present general inventive concept as defined by the following claims.

What is claimed is:

1. A method of manufacturing an inkjet printhead, comprising:

forming a chamber layer above a substrate, the chamber layer having a plurality of ink chambers;

forming a sacrificial layer in the chamber layer, the sacrificial layer configured to fill a space associated with the plurality of ink chambers of the chamber layer;

forming a nozzle layer above the chamber layer and the sacrificial layer, the nozzle layer having a plurality of nozzles;

preparing an etching mask having at least one linear etching pattern on a bottom surface of the substrate, the at least one linear etching pattern configured to define a portion of the substrate in which an ink feed hole is to be formed;

etching the substrate through the linear etching pattern until the sacrificial layer is exposed and a through hole is formed, the through hole defining the portion of the substrate in which the ink feed hole is to be formed; and removing the sacrificial layer and the portion of the substrate surrounded by the through hole to form the ink feed hole, wherein the at least one linear etching pattern defines a non-closed loop, respective end portions of two neighboring linear etching patterns being spaced apart from each other by a gap.

2. The method of claim 1, wherein the step of etching of the substrate includes forming a plurality of substrate connections that connect the portion of the substrate in which the ink feed hole is to be formed and the portion of the substrate that surrounds the portion of the substrate in which the ink feed hole is to be formed, the substrate connections being formed on the bottom portion of the substrate and associated with the gaps between two neighboring linear etching patterns.

3. The method of claim 2, wherein the portion of the substrate in which the ink feed hole is to be formed is removed by an ultrasonic process that is applied concurrently during the removal of the sacrificial layer.

* * * * *